(12) United States Patent
Li et al.

(10) Patent No.: US 12,520,727 B2
(45) Date of Patent: Jan. 6, 2026

(54) CANTILEVER ARRAY

(71) Applicant: KABUSHIKI KAISHA TOSHIBA, Tokyo (JP)

(72) Inventors: Yongfang Li, Kawasaki (JP); Kazuo Watabe, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 991 days.

(21) Appl. No.: 17/651,950

(22) Filed: Feb. 22, 2022

(65) Prior Publication Data

US 2023/0083674 A1 Mar. 16, 2023

(30) Foreign Application Priority Data

Sep. 14, 2021 (JP) .................................. 2021-149326

(51) Int. Cl.
*H01L 41/113* (2006.01)
*G01H 11/08* (2006.01)
*H10N 30/30* (2023.01)
*H10N 30/87* (2023.01)

(52) U.S. Cl.
CPC ........... *H10N 30/306* (2023.02); *G01H 11/08* (2013.01); *H10N 30/302* (2023.02); *H10N 30/87* (2023.02)

(58) Field of Classification Search
CPC .... H10N 30/30; H10N 30/302; H10N 30/304; H10N 30/306; H10N 30/308
USPC .................................. 310/330, 332, 338, 339
See application file for complete search history.

(56) References Cited

U.S. PATENT DOCUMENTS

| | | | |
|---|---|---|---|
| 2004/0075363 A1* | 4/2004 | Malkin | ................ H10N 30/306 310/321 |
| 2007/0125176 A1* | 6/2007 | Liu | ........................ H02N 2/188 73/579 |
| 2019/0360880 A1 | 11/2019 | Li | |
| 2020/0319228 A1 | 10/2020 | Li | |

FOREIGN PATENT DOCUMENTS

| | | |
|---|---|---|
| JP | 60-92671 A | 5/1985 |
| JP | 2017-9563 A | 1/2017 |
| JP | 2019-174254 A | 10/2019 |
| JP | 2019-204918 A | 11/2019 |
| JP | 2020-46322 A | 3/2020 |
| KR | 10-1509342 B1 | 4/2015 |

* cited by examiner

*Primary Examiner* — Derek J Rosenau
(74) *Attorney, Agent, or Firm* — Oblon, McClelland, Maier & Neustadt, L.L.P.

(57) ABSTRACT

According to one embodiment, a cantilever array includes a plurality of cantilever pairs. Each of the cantilever pairs includes a first cantilever and a second cantilever facing the first cantilever while having a gap, and which are arrayed in a direction orthogonal to a facing direction. Positions of the gaps of the cantilever pairs shift from each other when viewing in an array direction.

11 Claims, 5 Drawing Sheets

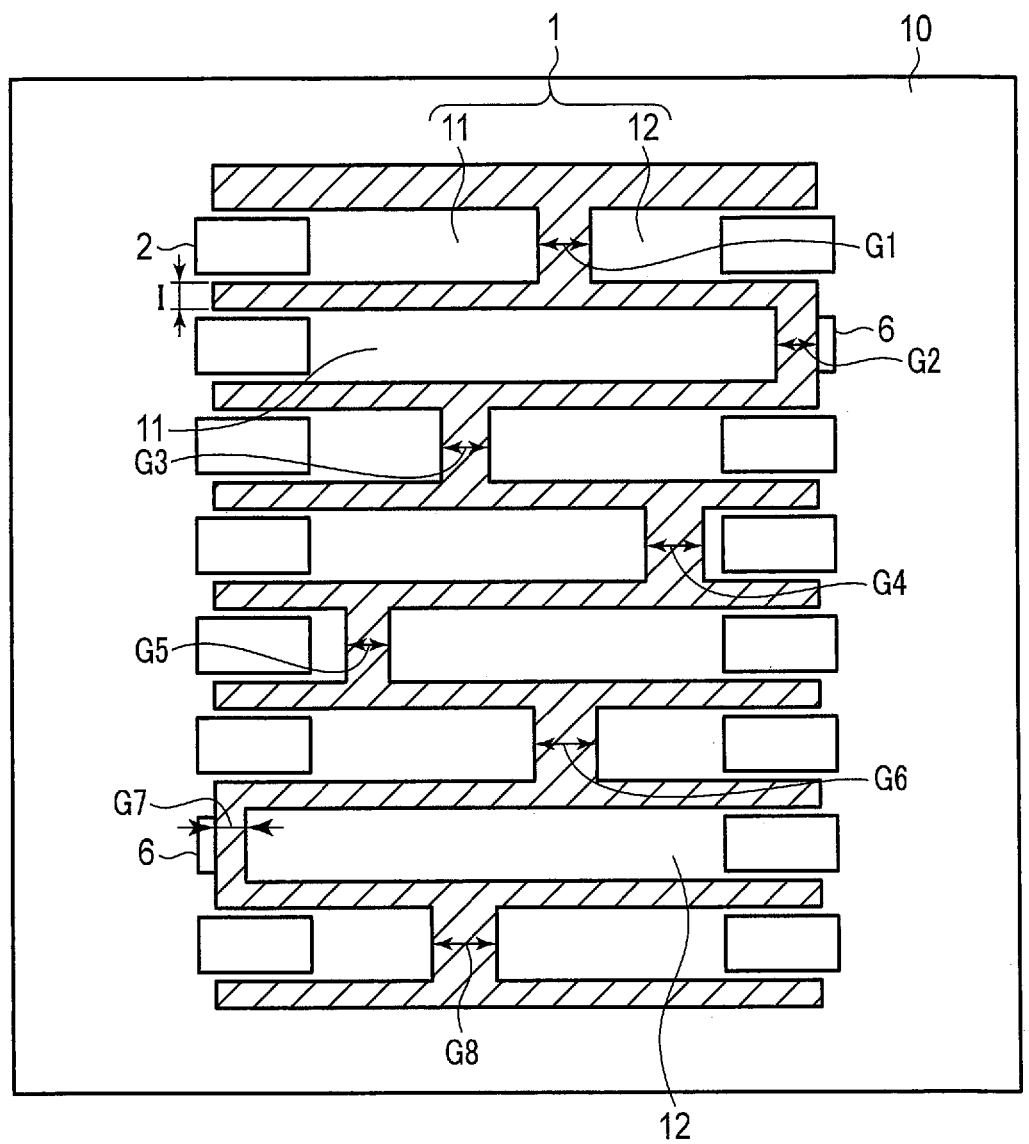
F I G. 1

CANTILEVER ARRAY

CROSS-REFERENCE TO RELATED APPLICATIONS

This application is based upon and claims the benefit of priority from the Japanese. Patent Application No. 2021-149326, filed Sep. 14, 2021, the entire contents of which are incorporated herein by reference.

FIELD

Embodiments described herein relate generally to a cantilever array.

BACKGROUND

There is known a sensor that detects a small vibration and detects an electromagnetic field using a cantilever. The length of the cantilever in this type of sensor is set in accordance with the frequency of a vibration to be detected and the like. Therefore, if, for example, there are many kinds of frequencies of vibrations to be detected, it is desirable to mount, on one chip, a plurality of cantilevers of difference resonance frequencies, that is, different lengths according to those frequencies.

The cantilever needs to be configured to have a length corresponding to a purpose. Thus, the fill factor of the cantilevers in the chip on which the cantilevers are mounted tends to be low. When the fill factor of the cantilevers in the chip is low, the number of chips that can be manufactured from one substrate tends to decrease, and the cost of the chip per unit tends to increase.

The fill factor is improved by decreasing the arrangement interval between the cantilevers. However, if the arrangement interval between cantilevers is smaller, when a given cantilever vibrates, collision between gas molecules around the cantilever and the vibrating cantilever increases, thereby increasing the air viscous resistance received by another cantilever. As a result, the amplitude of each cantilever tends to be small. This embodiment provides a cantilever array that improves the fill factor while reducing the influence of the air viscous resistance received by a cantilever at the time of vibration.

BRIEF DESCRIPTION OF THE DRAWINGS

FIG. 1 is a plan view of a sensor module including a cantilever array according to the first embodiment;

DETAILED DESCRIPTION

In general, according to one embodiment, a cantilever array includes a plurality of cantilever pairs. Each of the cantilever pairs includes a first cantilever and a second cantilever facing the first cantilever while having a gap, and which are arrayed in a direction orthogonal to a facing direction. Positions of the gaps of the cantilever pairs shift from each other when viewing in an array direction.

Embodiments will be described below with reference to the accompanying drawings.

[First Embodiment]

Figure 2:
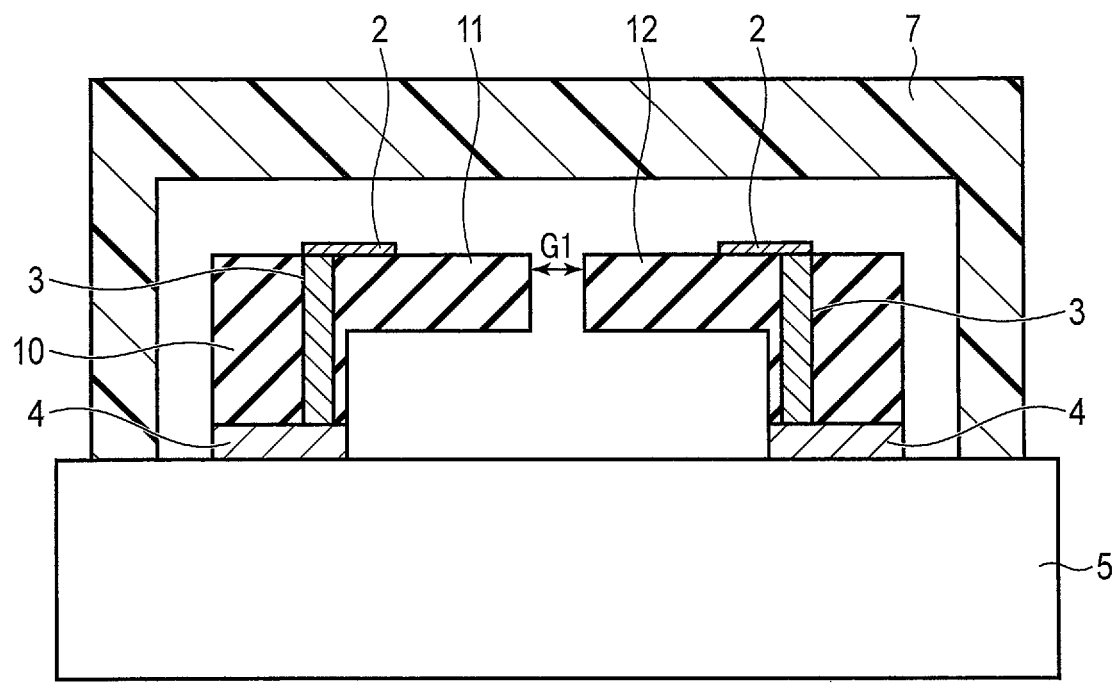
FIG. 2 is a sectional view of the sensor module shown in FIG. 1.

FIG. 1 is a plan view of a sensor module including a cantilever array according to the first embodiment. FIG. 2 is a sectional view of the sensor module shown in FIG. 1.

As shown in FIG. 1, the cantilever array includes a plurality of first cantilevers 11 and a plurality of second cantilevers 12. For example, each of the first cantilevers 11 and the second cantilevers 12 is formed integrally with a supporting member 10 in the upper end portion of the inner wall surface of the supporting member 10 that is formed to have a concave space. Referring to FIG. 1, the seven first cantilevers 11 are formed at equal intervals on the left inner wall surface of the supporting member 10.

Each first cantilever 11 is formed rightward from the left inner wall surface of the supporting member 10. Furthermore, the seven second cantilevers 12 are formed at equal intervals on the right inner wall surface of the supporting member 10. Each second cantilever 12 is formed leftward from the right inner wall surface of the supporting member 10. Each of the first cantilevers 11 and the second cantilevers 12 is a piezoelectric cantilever that vibrates by, for example, an external vibration, and generates a voltage by the inverse piezoelectric effect along with the vibration.

The number of first cantilevers 11 and the number of second cantilevers 12 are not limited to seven. Furthermore, the number of first cantilevers 11 and the number of second cantilevers 12 are basically equal to each other. However, the number of first cantilevers 11 and the number of second cantilevers 12 need not always be equal to each other depending on the arrangement of a reference electrode (to be described later).

In the embodiment, for example, all the lengths of the cantilevers are different. For example, when Lm (m=1, 2, . . . , 14) represents the length of each of the 14 cantilevers shown in FIG. 1, L14>L13> . . . > L1 holds. Among them, for example, L13, L11, . . . , L1 represent the lengths of the first cantilevers 11. Furthermore, L14, L12, . . . , L2 represent the lengths of the second cantilevers 12.

In the embodiment, some of the first cantilevers 11 and some of the second cantilevers 12 form cantilever pairs 1 but some of the first cantilevers 11 and some of the second cantilevers 12 do not form the cantilever pairs 1. In the example shown in FIG. 1, the longest first cantilever 11 does not form the cantilever pair 1, and the longest second cantilever 12 also does not form the cantilever pair 1. In an example shown in FIG. 2, the first cantilever 11 of the second row in the cantilever array is the longest first cantilever 11 having the length L13. This first cantilever 11 of the second row does not form the cantilever pair with the second cantilever 12. Similarly, the second cantilever 12 of the seventh row in the cantilever array is the longest second cantilever 12 having the length L14. This second cantilever 12 of the seventh row also does not form the cantilever pair with the first cantilever 11.

On the other hand, the cantilevers having the third and subsequent longest lengths form the cantilever pairs 1. More specifically, in the example shown in FIG. 1, with respect to the first, third, fourth, fifth, sixth, and eighth rows in the cantilever array, the first cantilevers 11 and the second cantilevers 12 form the cantilever pairs 1. The first cantilevers 11 and the second cantilevers 12 forming the cantilever pairs are selected so that the differences between the sums of the lengths of the cantilevers of the respective cantilever pairs are small.

For example, the long first cantilever 11 and the short second cantilever 12 can form the cantilever pair 1. Similarly, the short first cantilever 11 and the long second cantilever 12 can form the cantilever pair 1. More specifically, for example, the first cantilever having the third longest length L12 and the cantilever having the shortest length Li can form the cantilever pair, and the cantilever having the fourth longest length L11 and the cantilever having the second shortest length L2 can form the cantilever pair.

The distal end surfaces of the first cantilevers 11 and the second cantilevers 12 forming the cantilever pairs 1, respectively, face each other while having gaps G1, G3, G4, G5, G6, and G8 sequentially from the first row. The gaps G1, G3, G4, G5, G6, and G8 are gaps having widths larger than an interval I of the array of the first cantilevers 11 and the second cantilevers 12. On the other hand, the distal end surface of the first cantilever 11 not forming the cantilever pair 1 and the right inner wall surface of the supporting member 10 face each other while having a gap G2. The distal end surface of the second cantilever 12 not forming the cantilever pair 1 and the left inner wall surface of the supporting member 10 face each other while having a gap G7. Similar to the gap G1, the gaps G2 and G7 are also gaps having widths larger than the interval I of the array of the first cantilevers 11 and the second cantilevers 12. Furthermore, in the embodiment, since the lengths of the cantilevers are different, the positions of the gaps G1 to G8 are all different when viewing in the array direction of the cantilever pairs.

In this example, the length of each first cantilever 11 and the length of each second cantilever 12 need only be different. The actual length values of each first cantilever 11 and each second cantilever 12 are decided appropriately. For example, the length of the first cantilever 11 and that of the second cantilever 12 may be decided to have resonance frequencies corresponding to the frequency of a vibration to be sensed. On the other hand, since the gaps G1 to G8 desirably have widths larger than the interval I of the array of the first cantilevers 11 and the second cantilevers 12, it is more desirable to decide, for each cantilever pair, the lengths of the cantilevers forming the cantilever pair within a range in which it is possible to obtain a gap having a width larger than the interval I of the array.

As shown in FIG. 1, a sensing electrode 2 is formed at the root of each of the first cantilevers 11 and the second cantilevers 12. Each sensing electrode 2 is formed to a position between the root of the cantilever and a position of ½ of the length of the cantilever with respect to the extending direction of the cantilever. Furthermore, part of each sensing electrode 2 is formed to protrude to a cantilever supporting portion of the supporting member 10. As shown in FIG. 2, a through wiring 3 is pulled out from the protruded portion of the sensing electrode 2. The through wiring 3 is connected to a CMOS circuit 5 via an electrode pad 4. The sensing electrode 2 can also be connected to CMOS circuit 5 via wirebonding. Furthermore, as shown in FIG. 1, in the embodiment, in the upper end portion of the supporting member 10 facing the first cantilever 11 or the second cantilever 12 not forming the cantilever pair 1, a reference electrode 6 is formed. The reference electrode 6 has the same shape as that of the wiring connecting portion of the sensing electrode 2, that is, the protruded portion of the sensing electrode 2. Although not shown in FIG. 2, the through wiring 3 is also pulled out from the reference electrode 6, similar to the sensing electrode 2. The through wiring 3 is connected to the CMOS circuit 5 via the electrode pad 4.

The CMOS circuit 5 serving as a processing circuit includes, for example, CMOS switches and a vibration detection circuit. Each CMOS switch is connected to each sensing electrode 2, and is turned on by a sensor output voltage caused by a vibration of the corresponding cantilever. The vibration detection circuit detects the vibrating cantilever by monitoring the ON/OFF states of the CMOS switches. The CMOS circuit 5 is configured to input, to the CMOS switch, as a sensor output, a signal of the difference between a signal output from each sensing electrode 2 and a signal output from each reference electrode 6. The signal output from each reference electrode 6 is a signal depending on not the vibration of the cantilever but a parasitic capacitance between the wiring portion and the substrate of the CMOS circuit. The parasitic capacitance can be generated when electrodes are arranged densely. By obtaining the difference between the signal output from the sensing electrode 2 and the signal output from the reference electrode 6, the influence by the parasitic capacitance on the signal output from the sensing electrode 2 is removed. By monitoring the ON/OFF states of the CMOS switches by the sensor outputs, the presence/absence of a vibration of the cantilever array can be detected correctly. Then, when the resonance frequency of the cantilever is set to the frequency of the vibration to be detected, the presence/absence of the vibration to be detected can be detected in accordance with the presence/absence of a vibration of the cantilever.

In the first embodiment, two reference electrodes 6 are formed. At least one reference electrode 6 needs to be formed. For example, in the first embodiment, the reference electrode 6 is formed in the upper end portion of the supporting member 10 on each of the side of the first cantilever 11 and the side of the second cantilever 12. To the contrary, the reference electrode 6 may be formed in the upper end portion of the supporting member 10 on only one of the side of the first cantilever 11 and the side of the second cantilever 12. The number of reference electrodes 6 and their arrangement positions may be decided appropriately in accordance with the ease of formation of a wiring to the CMOS circuit 5 and the like.

Furthermore, as shown in FIG. 2, the sensor module including the cantilever array is desirably sealed by a cap 7. The pressure in the cap 7 is more desirably reduced to the reduced pressure atmosphere in which the pressure is higher than the vacuum but lower than the atmospheric pressure.

As described above, in the first embodiment, by arraying cantilever pairs each formed from two facing cantilevers in a direction orthogonal to the facing direction, it is expected to improve the fill factor. By arranging cantilevers to face each other, one cantilever may vibrate by receiving the influence of the air viscous resistance when the other cantilever vibrates. To the contrary, in the first embodiment, since two cantilevers are arranged to have a gap, the influence on one cantilever by the air viscous resistance when the other cantilever vibrates is reduced. Furthermore, when the width of the gap is larger than the interval of the array of the cantilevers, the relatively large influence on one cantilever by a vibration of the distal end portion of the other cantilever is suppressed.

In the embodiment, the positions of the gaps when viewing in the array direction of the cantilever pairs, that is, the positions of the distal end portions of the cantilevers of the respective cantilever pairs shift from each other. This can reduce the influence on the cantilevers of another cantilever pair by the air viscous resistance when the distal end portion of a given cantilever vibrates with a large amplitude.

As described above, in the first embodiment, since the influence on another cantilever when a given cantilever vibrates is reduced, it is possible to decrease the arrangement interval between the cantilevers. Therefore, the fill factor of the cantilevers in the chip is improved.

Furthermore, in the first embodiment, the long cantilever does not form the cantilever pair with another cantilever. On the other hand, in a portion of the supporting member facing the cantilever not forming the cantilever pair, the reference electrode is arranged. The CMOS circuit processes, as a sensor output, the difference between the signal output from the sensing electrode and the signal output from the reference electrode. This removes the influence on the signal caused by a vibration of the cantilever by the parasitic capacitance between the wiring portion and the substrate of the. CMOS circuit. This can also decrease the arrangement interval between the cantilevers. Therefore, the chip area can effectively be used.

In the embodiment, the cantilever array is sealed by a pressure lower than the atmospheric pressure. This further suppresses the influence of the air viscous resistance. As a result, the cantilevers can be arranged at smaller intervals. This can improve the fill factor of the cantilevers in the chip. Furthermore, when the cantilevers are sealed by a low pressure which is not the vacuum, the time from the start of sensing of the cantilever until the state returns to the steady state can be shortened.

In the embodiment, the sensing electrode is formed to a position between the root of the cantilever and a position of ½ of the length of the cantilever. Since the stress of the cantilever tends to concentrate on a portion around the root, it is expected to improve the sensitivity of sensing by setting a portion around the root of the cantilever as the range of formation of the sensing electrode.

In the embodiment, all the lengths of the cantilevers are different. However, not all the lengths of the cantilevers need to be different.

[Second Embodiment]

Figure 3:
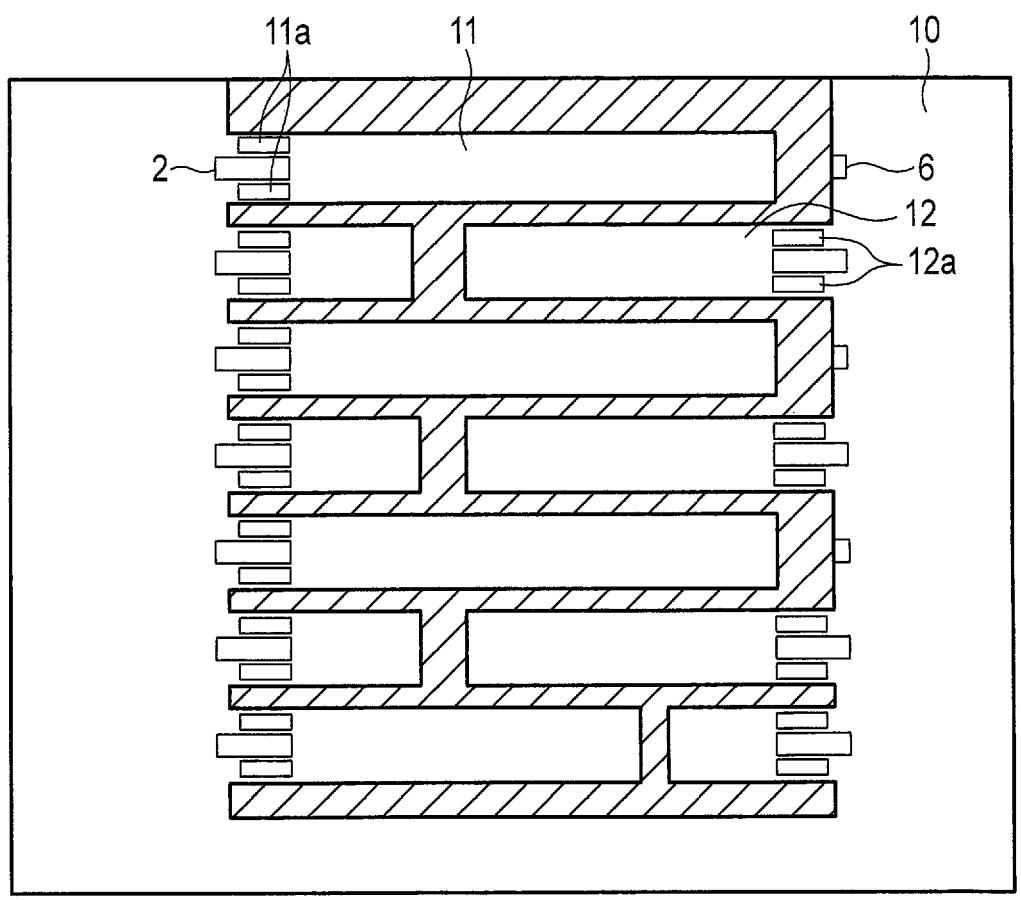
FIG. 3 is a plan view of a sensor module including a cantilever array according to the second embodiment.

The second embodiment will be described next. FIG. 3 is a plan view of a sensor module including a cantilever array according to the second embodiment. A description of the same components in FIG. 3 as those described in the first embodiment will be omitted or simplified appropriately.

In the second embodiment, two grooves or holes 11a are formed at the root of each first cantilever 11 while two grooves 12a are formed at the root of each second cantilever 12. The remaining components are the same as in the first embodiment.

According to the above-described second embodiment, in addition to the effect described in the first embodiment, the stress by a vibration of a cantilever concentrates more on a portion around the root of the cantilever by forming grooves at the root of the cantilever. Thus, it is expected to improve the sensitivity of sensing.

In the second embodiment, two grooves are formed at the root of each cantilever. However, the number of grooves is not limited to two. That is, the number of grooves is one or more.

In FIG. 3, the opening shape of each groove is rectangular. However, the opening shape of each groove is not limited to the rectangle, and may be another shape such as a circle or ellipse.

[Third Embodiment]

Figure 4:
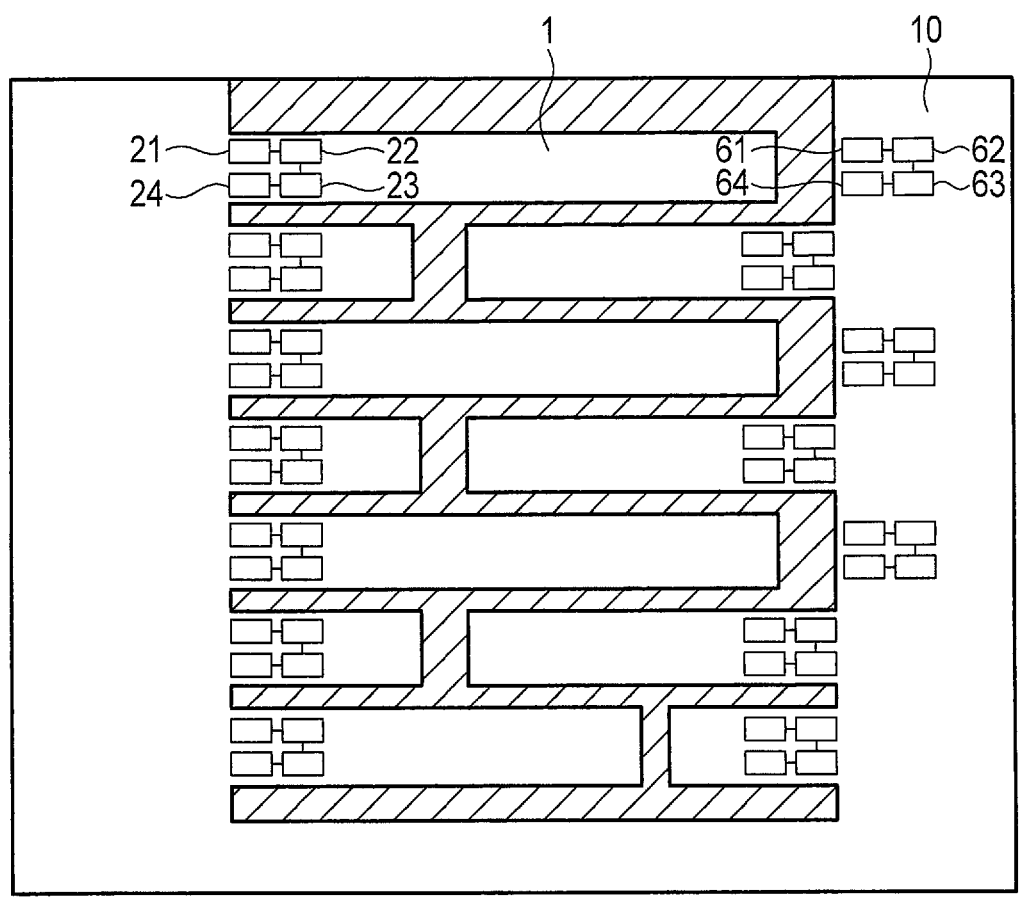
FIG. 4 is a plan view of a sensor module including a cantilever array according to the third embodiment.

The third embodiment will be described next. FIG. 4 is a plan view of a sensor module including a cantilever array according to the third embodiment. A description of the same components in FIG. 4 as those described in the first embodiment will be omitted or simplified appropriately. In the third embodiment, a sensing electrode 2 formed in each cantilever is divided into four sensing electrode elements 21, 22, 23, and 24. The sensing electrode elements 21, 22, 23, and 24 are connected electrically in series. Then, a through wiring 3 that is the same as that shown in FIG. 2 is pulled out from the sensing electrode element 24.

The through wiring 3 is connected to a CMOS circuit 5 via an electrode pad 4.

Similar to the first embodiment, in the third embodiment as well, the sensing electrode elements 21, 22, 23, and 24 are formed to a position between the root of the cantilever to a position of ½ of the length of the cantilever.

Furthermore, in the third embodiment, similar to the sensing electrode 2, a reference electrode 6 is also divided into four reference electrode elements 61, 62, 63, and 64. The reference electrode elements 61, 62, 63, and 64 are connected in series. The through wiring 3 that is the same as that shown in FIG. 2 is pulled out from the reference electrode element 64. The through wiring 3 is connected to the CMOS circuit 5 via the electrode pad 4. That is, the reference electrode elements 61, 62, 63, and 64 have the same shapes and connection structure as those of the sensing electrode elements 21, 22, 23, and 24.

According to the above-described third embodiment, in addition to the effect described in the first embodiment, it is expected to improve the sensitivity of sensing. In the third embodiment, the four sensing electrode elements are formed at the root of each cantilever but the number of sensing electrode elements is not limited to four.

Furthermore, in the third embodiment, a groove may be formed at the root of each cantilever.

[Fourth Embodiment]

Figure 5:
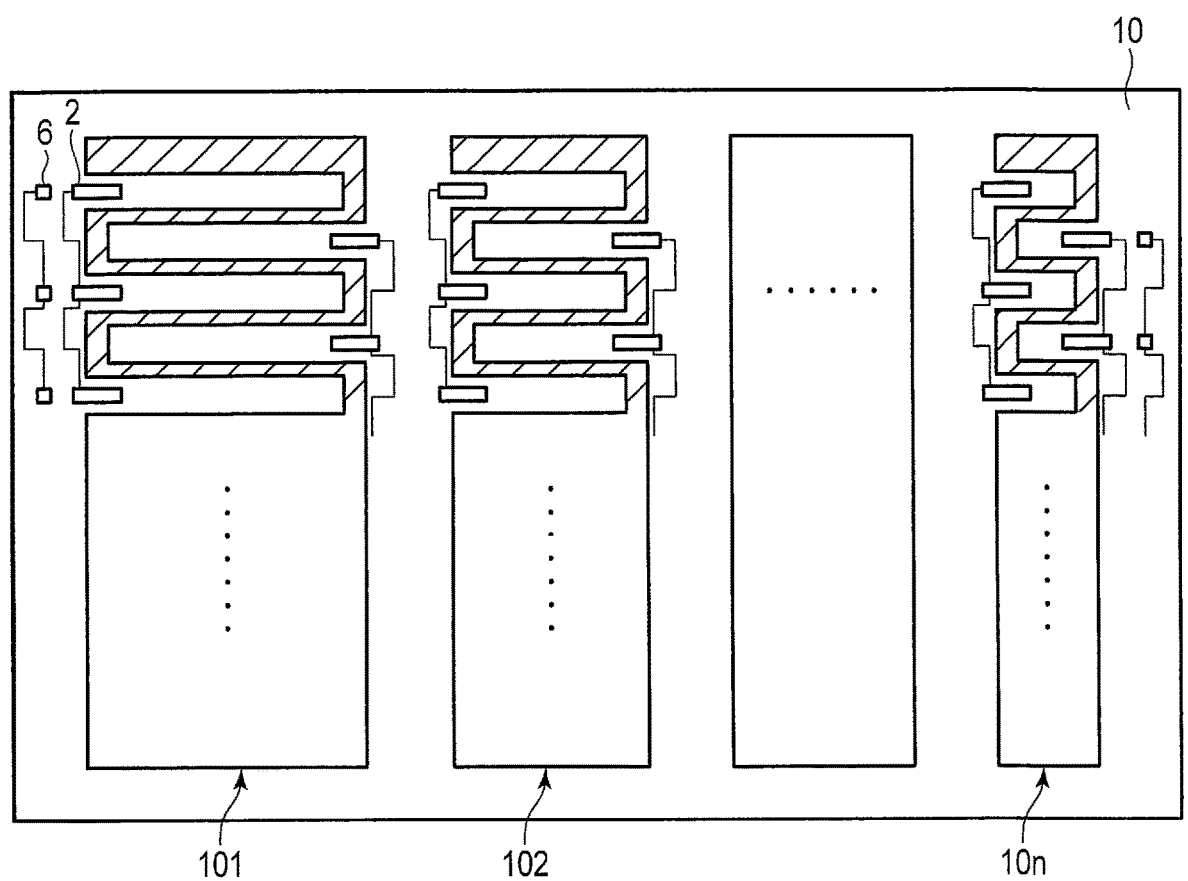
FIG. 5 is a plan view of a sensor module including a cantilever array according to the fourth embodiment.

The fourth embodiment will be described next. FIG. 5 is a plan view of a sensor module including a cantilever array according to the fourth embodiment. As shown in FIG. 5, the cantilever array according to the fourth embodiment includes n cantilever sets 101, 102, . . . , 10n (n is a natural number) formed to have gaps. Each of the cantilever sets 101, 102, . . . , 10n includes a plurality of cantilevers having the equal lengths. Among the cantilever sets 101, 102, . . . , 10n, the lengths of the cantilevers are different from each other.

In one cantilever set, the plurality of cantilevers are alternately formed in a comb shape. More specifically, the cantilevers of the odd-numbered rows in each cantilever set are formed rightward from the left inner wall surface of a supporting member 10. The cantilevers of the even-numbered rows in each cantilever set are formed leftward from the right inner wall surface of the supporting member 10.

Furthermore, a sensing electrode 2 is formed at the root of each cantilever. The sensing electrodes 2 formed on the same side are connected electrically in series. More specifically, the sensing electrodes 2 of the odd-numbered rows are connected in series in protruded portions to the supporting member 10 while the sensing electrode 2 of the even-numbered rows are connected in series in protruded portions to the supporting member 10. Then, a through wiring 3 that is the same as that shown in FIG. 2 is pulled out from each of the sensing electrode 2 of the final row of the odd-numbered rows and the sensing electrode 2 of the final row of the even-numbered rows. The through wiring 3 is connected to a CMOS circuit 5 via an electrode pad 4.

Furthermore, on the surface of the supporting member, reference electrodes 6 having the same shapes and connection structure as those of the protruded portions of the sensing electrodes 2 are formed. More specifically, the reference electrodes 6 of the odd-numbered rows are connected in series while having the same shapes as those of the protruded portions of the sensing electrodes 2 of the odd-numbered rows. Furthermore, the reference electrodes 6 of the even-numbered rows are connected in series while having the same shapes as those of the protruded portions of the sensing electrodes 2 of the even-numbered rows. Then, the through wiring 3 which is the same as that shown in FIG. 2 is pulled out from each of the reference electrode 6 of the final row of the odd-numbered rows and the reference electrode 6 of the final row of the even-numbered rows. The through wiring 3 is connected to the CMOS circuit 5 via the electrode pad 4.

Even in the structure according to the above-described fourth embodiment, the fill factor of the cantilevers in the chip is improved. According to the fourth embodiment, when the sensing electrodes 2 of the cantilevers are connected in series in each cantilever set, it is expected to improve the sensitivity of sensing.

[Other Modifications]

In the above-described embodiments, each cantilever is assumed to be a piezoelectric cantilever. Each cantilever may be an electrostatic cantilever that operates by an electrostatic force.

Furthermore, in the embodiments, the cantilever is used for sensing. The embodiments can also be applied to an actuator that operates a cantilever by applying a voltage.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A cantilever array comprising:
a plurality of cantilever pairs each of which includes a first cantilever and a second cantilever facing the first cantilever while having a gap, and which are arrayed in a direction orthogonal to a facing direction,
wherein positions of the gaps of the cantilever pairs shift from each other when viewing in an array direction; and
a third cantilever that does not face the second cantilever and a fourth cantilever that does not face the first cantilever,
wherein a first sensing electrode is formed at a root of each of the first cantilevers,
wherein a second sensing electrode is formed at a root of each of the second cantilevers,
wherein a first reference electrode corresponding to the first sensing electrode is formed in a first supporting portion that supports the third cantilever, and
wherein a second reference electrode corresponding to the second sensing electrode is formed in a second supporting portion that supports the fourth cantilever.

2. The cantilever array of claim 1, wherein lengths of the first cantilever and the second cantilever of each of the plurality of cantilever pairs are different from each other.

3. The cantilever array of claim 2, wherein the lengths of the first cantilever and the second cantilever of each of the plurality of cantilever pairs are decided in accordance with resonance frequencies.

4. The cantilever array of claim 1, wherein widths of the gaps are larger than an interval of the array of the cantilever pairs.

5. The cantilever array of claim 1, wherein
the first reference electrode is an electrode having the same shape as a shape of a portion connected to a wiring of the first sensing electrode, and
the second reference electrode is an electrode having the same shape as a shape of a portion connected to a wiring of the second sensing electrode.

6. The cantilever array of claim 1, further comprising a processing circuit configured to process, as sensor outputs, a difference between a signal output from each of the first sensing electrodes and a signal output from the first reference electrode and a difference between a signal output from each of the second sensing electrodes and a signal output from the second reference electrode.

7. The cantilever array of claim 1, wherein
a plurality of first electrode elements connected in series are formed at a root of each of the first cantilevers, and
a plurality of second electrode elements connected in series are formed at a root of each of the second cantilevers.

8. The cantilever array of claim 7, wherein
each of the first electrode elements is arranged between the root of the first cantilever and a position of ½ of a length of the first cantilever, and
each of the second electrode elements is arranged between the root of the second cantilever and a position of ½ of a length of the second cantilever.

9. The cantilever array of claim 1, wherein at least one groove is formed at a root of each of the first cantilevers and the second cantilevers.

10. The cantilever array of claim 1, wherein a plurality of grooves are formed at a root of each of the first cantilevers and the second cantilevers.

11. The cantilever array of claim 1, wherein each of the first cantilevers and the second cantilevers is one of a piezoelectric cantilever and an electrostatic cantilever.

* * * * *